(12) United States Patent
Kim et al.

(10) Patent No.: US 7,915,113 B2
(45) Date of Patent: Mar. 29, 2011

(54) SEMICONDUCTOR DEVICE AND METHOD FOR MANUFACTURING THE SAME

(75) Inventors: Jin Soo Kim, Icheon-si (KR); Chang Moon Lim, Anyang-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 178 days.

(21) Appl. No.: 12/250,989

(22) Filed: Oct. 14, 2008

(65) Prior Publication Data

US 2009/0101970 A1 Apr. 23, 2009

(30) Foreign Application Priority Data

Oct. 17, 2007 (KR) .......................... 10-2007-0104702

(51) Int. Cl.
*H01L 21/8238* (2006.01)

(52) U.S. Cl. ... 438/206; 438/270; 257/302; 257/E27.057

(58) Field of Classification Search .......... 438/253–256, 438/396–399, 206, 209, 270; 257/302, E27.057
See application file for complete search history.

(56) References Cited

U.S. PATENT DOCUMENTS

| | | | |
|---|---|---|---|
| 2006/0097304 A1* | 5/2006 | Yoon et al. | 257/307 |
| 2007/0152255 A1* | 7/2007 | Seo et al. | 257/302 |

* cited by examiner

*Primary Examiner* — Brook Kebede

(74) *Attorney, Agent, or Firm* — Marshall, Gerstein & Borun LLP

(57) ABSTRACT

A method for manufacturing a semiconductor device including a vertical cell transistor structure may include forming a vertical cell transistor structure over a semiconductor substrate of a cell region; forming an insulating film over the vertical cell transistor structure; planarizing the insulating film to expose a hard mask film disposed at a top portion of the vertical cell transistor structure; and forming a storage node contact by removing the hard mask film.

10 Claims, 3 Drawing Sheets

SEMICONDUCTOR DEVICE AND METHOD FOR MANUFACTURING THE SAME

CROSS-REFERENCE TO RELATED APPLICATION

The present application claims priority to Korean patent application number 10-2007-0104702, filed on Oct. 17, 2007 which is incorporated by reference in its entirety.

BACKGROUND OF THE INVENTION

The present invention relates to a method for manufacturing a semiconductor device including a vertical cell transistor structure, and more specifically, to a method for manufacturing a semiconductor device including forming a self-aligned storage node contact without a mask process.

Due to increase of integration of semiconductor devices, a planar area occupied by electron elements included in a semiconductor device has been shrunken. In the case of planar transistors, a channel width of the transistor is reduced to increase the integration of the semiconductor device. Since the channel width is proportional to a drain current, if the channel width is reduced, current transmission capacity of the transistor is degraded. As a result, the planar transistor does not both improve the transistor characteristics and increase of the integration in the transistor.

In order to overcome the limits of the planar transistor, a vertical transistor has been suggested. The vertical transistor includes a vertical gate formed at a side surface of a polysilicon pillar, a source formed in the bottom of the pillar and a drain formed in the top of the pillar.

A channel length of the vertical transistor is not limited by a current exposer and exposing method. The vertical transistor has a shorter channel length than that of the planar transistor because the channel length can be adjusted by regulation of the height of the pillar. Also, the vertical gate is formed at the side surface of the pillar so that the vertical transistor may have a broader channel width than that of the planar transistor. As a result, the vertical transistor has a faster switching ability and a greater power driving ability.

However, when a vertical cell transistor is used in a cell region, bit line contacts such as a bit line contact for connecting a bit line having an active area to a core region, a word line contact of the vertical cell transistor, a gate contact of the transistor formed in a peripheral circuit region and a junction region contact of the transistor formed in the peripheral circuit region have various depths, so that the bit line contacts are not formed by one contact process simultaneously.

The bit line contacts for connecting a bit line located in the bottom of the cell region as an active area type to a core region can be formed by several exposure and etching processes. As a result, the process for manufacturing a semiconductor device using the vertical cell transistor is complicated to degrade yield and increase manufacturing cost.

SUMMARY OF THE INVENTION

Various embodiments of the present invention are directed at providing a method for manufacturing a semiconductor device that comprises forming a self-aligned storage node contact without a mask process.

According to an embodiment of the present invention, a method for manufacturing a semiconductor device may include forming a vertical cell transistor structure over a semiconductor substrate of a cell region; forming an insulating film over the vertical cell transistor structure; planarizing the insulating film to expose a hard mask film disposed at a top portion of the vertical cell transistor structure; and forming a storage node contact by removing the hard mask film. Planarizing-the-insulating-film may be performed by a chemical mechanical polishing process. Removing-the-hard-mask-film may be performed by a dry or wet etching process. The method may further includes forming a storage node contact plug that fills the storage node contact.

According to an embodiment of the present invention, a method for manufacturing a semiconductor device may include preparing a semiconductor substrate including a cell region, a core/peripheral circuit region; forming a recess in the semiconductor substrate of the core/peripheral circuit region; forming a vertical cell transistor structure over the semiconductor substrate of the cell region and a gate over the recessed semiconductor substrate of the core/peripheral circuit region; forming an insulating film over the vertical cell transistor structure and the gate; planarizing the insulating film to expose a hard mask film disposed at a top portion of the vertical cell transistor structure; and forming a storage node contact by removing the hard mask film.

Recessing-the-semiconductor-substrate may be performed by a dry or wet etching process. The recess may be etched so that a top surface of the gate is formed to be lower than a top surface of the vertical cell transistor structure. The recess may have a depth ranging from 100 to 5000 Å. The method may further include forming a device isolating film in the recessed core/peripheral circuit region. Planarizing-the-insulating-film may be performed by a chemical mechanical polishing process. Removing-the-hard-mask-film may be performed by a dry or wet etching process. The method may further include forming a storage node contact plug that fills the storage node contact.

According to an embodiment of the present invention, a semiconductor device may include a vertical cell transistor structure formed in a cell region; a gate formed to be lower than a top portion of the vertical cell transistor structure in a core region and a peripheral circuit region; and an insulating film including a storage node contact that exposes a storage node junction region of the vertical cell transistor structure. The storage node junction region and the storage node contact may be self-aligned.

DETAILED DESCRIPTION OF THE SPECIFIC EMBODIMENT

Figure 1A:
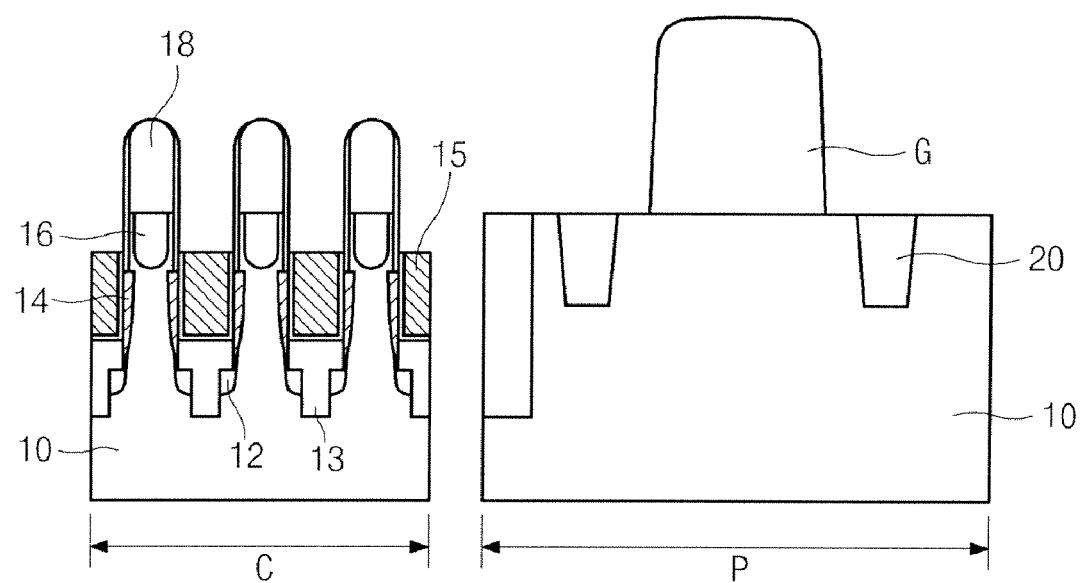
FIGS. 1a and 1b are cross-sectional diagrams illustrating a method for forming a storage node contact in a general vertical cell transistor structure.
Figure 1B:
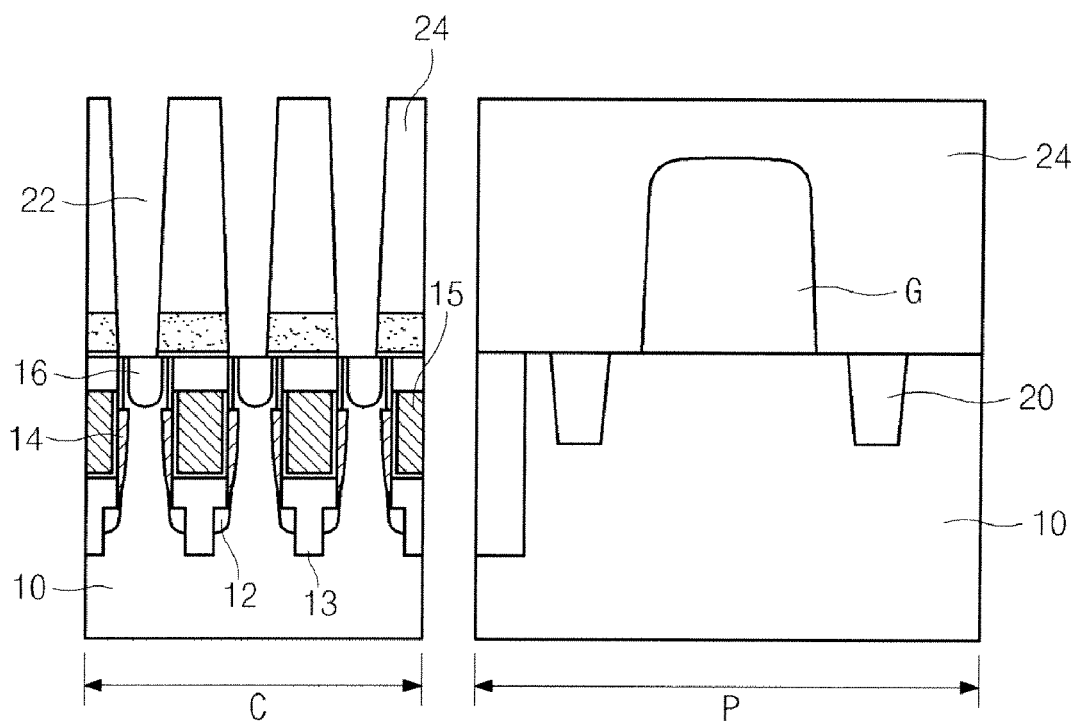

FIGS. 1a and 1b are cross-sectional diagrams illustrating a method for forming a storage node contact in a general vertical cell transistor structure. Referring to FIGS. 1a and 1b, a semiconductor device includes a cell region C and a core/peripheral region P. A vertical cell transistor structure is formed in the cell region C, and a planar gate electrode G is formed in the peripheral circuit region P.

The vertical cell transistor structure formed in the cell region C includes a bit line 12 having a junction region in a semiconductor substrate 10, a bit line isolating layer 13 having an oxide film, a surrounding gate electrode 14, a metal gate electrode 15 and a storage node junction region 16.

After a transistor including a pillar pattern of the cell region C, the bit line 12, the bit line isolating layer 13, the surrounding gate electrode 14 and the metal gate electrode 15 is formed, the gate electrode G of the core/peripheral circuit region P is formed. An insulating material 24 is deposited, and an etching process is performed with a storage node contact mask to form a storage node contact 22 in the cell region C.

In a process for forming a DRAM having the vertical cell transistor structure, a storage node contact is required to be overlapped with a pillar pattern having a narrow bottom portion. When the contact is formed to be small in order to increase an overlap margin, it is difficult to perform a patterning process and an overlay control.

Figure 2A:
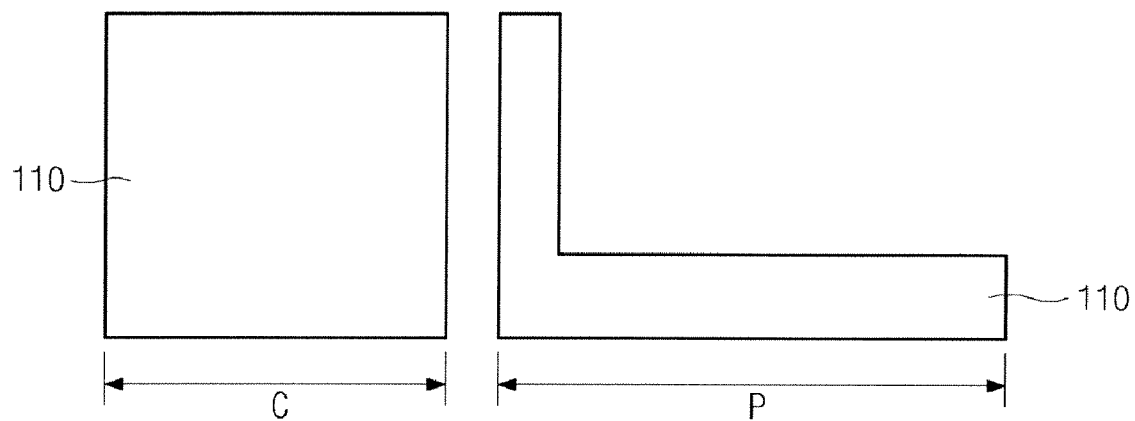
FIGS. 2a to 2d are cross-sectional diagrams illustrating a method for forming a storage node contact in a vertical cell transistor structure according to an embodiment of the present invention.

FIGS. 2a to 2d are cross-sectional diagrams illustrating a method for forming a storage node contact in a vertical cell transistor structure according to an embodiment of the present invention. As shown in FIG. 2a, a semiconductor substrate 110 includes a cell region C and a core/peripheral circuit region P. A dry or wet etching process is performed on the core/peripheral circuit region P of the semiconductor substrate 110 to form a recess.

A depth of the recess is etched to have a thickness ranging from 100 Å to 5000 Å, so that a top surface of a gate height to be formed in the core/peripheral circuit region P may be lower than a top surface of a vertical cell transistor structure to be formed in the cell region C.

Figure 2B:
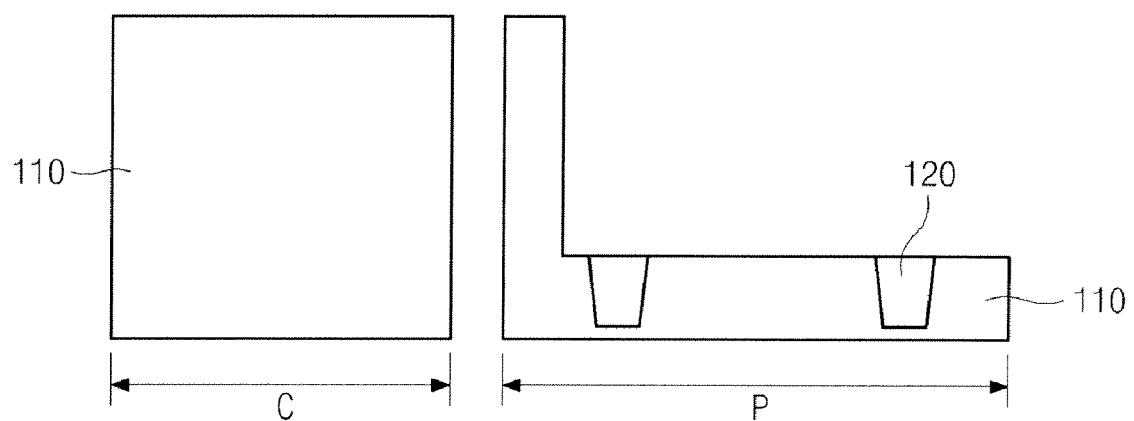

Referring to FIG. 2b, a device isolating film 120 is formed in the recessed semiconductor substrate 110.

Figure 2C:
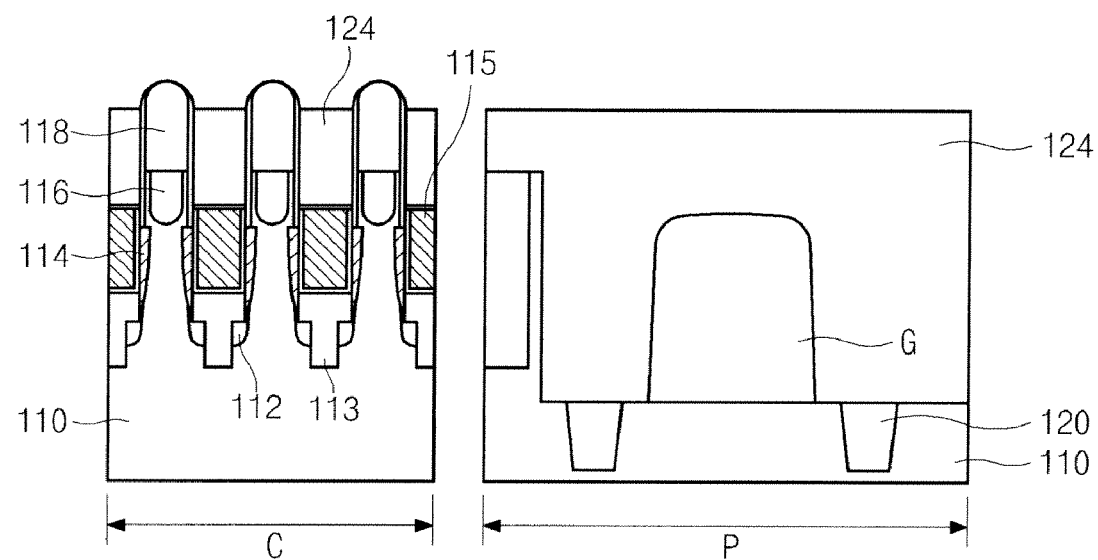

Referring to FIG. 2c, a vertical cell transistor structure is formed in the cell region C, and a gate G is formed in the core/peripheral circuit region P.

The vertical cell transistor structure includes a bit line 112 formed as a junction region in the semiconductor substrate 110, a bit line isolating layer 113 having an oxide film, a surrounding gate electrode 114, a metal gate electrode 115 and a storage node junction region 116 and a hard mask film 118 formed on the storage node junction region 116.

An insulating film 124 is deposited over the resulting structure including the vertical cell transistor structure and the gate G. The insulating film 124 is planarized to expose the hard mask film 118 of the vertical cell transistor structure. The planarizing process is performed by a chemical mechanical polishing process without a mask to obtain a self-aligned storage node contact.

Figure 2D:
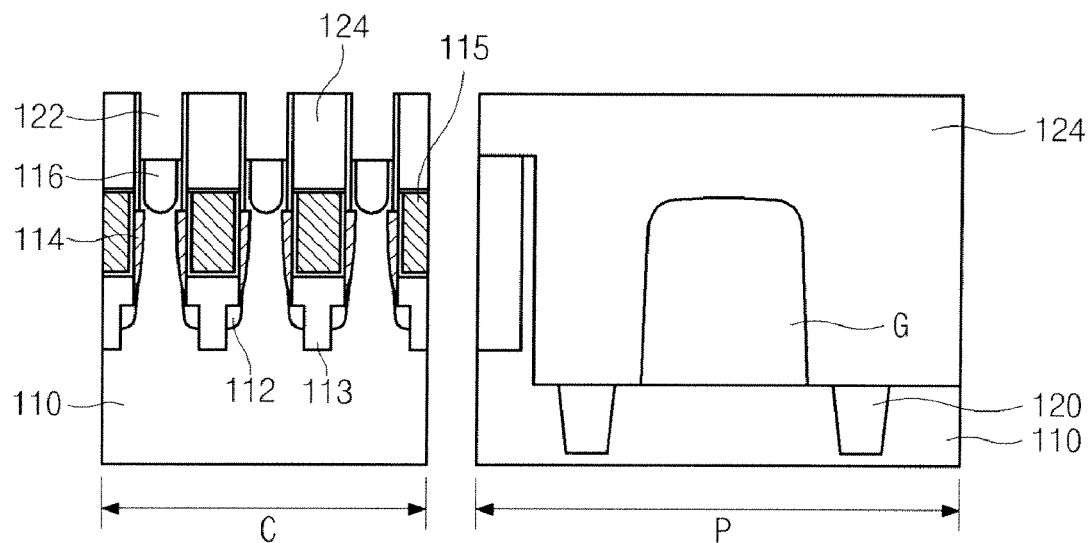

Referring to FIG. 2d, a dry or wet etching process is performed to selectively remove the hard mask film 118 of the vertical cell transistor structure to form a self-aligned storage node contact 122.

As described above, according to an embodiment of the present invention, a method for manufacturing a semiconductor device includes forming a self-aligned storage node contact in a vertical cell transistor structure without an additional mask process to facilitate and simplify the process.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising:
    preparing a semiconductor substrate including a cell region and a core/peripheral circuit region;
    forming a recess in the semiconductor substrate of the core/peripheral circuit region;
    forming a vertical cell transistor structure over the semiconductor substrate of the cell region and a gate within the recess of the core/peripheral circuit region;
    forming an insulating film over the vertical cell transistor structure and the gate;
    planarizing the insulating film to expose a hard mask film disposed at a top portion of the vertical cell transistor structure; and
    forming a storage node contact hole by removing the hard mask film.

2. The method according to claim 1, wherein recessing-the-semiconductor-substrate step comprises dry or wet etching.

3. The method according to claim 1, comprising etching the recess so that a top surface of the gate is formed to be lower than a top surface of the vertical cell transistor structure.

4. The method according to claim 1, wherein the recess has a depth ranging from 100 Å to 5000 Å.

5. The method according to claim 1, further comprising forming a device isolating film in the recessed core/peripheral circuit region.

6. The method according to claim 1, wherein planarizing-the-insulating-film step comprises chemical mechanical polishing.

7. The method according to claim 1, wherein removing-the-hard-mask-film step comprises dry or wet etching.

8. The method according to claim 1, further comprising forming a storage node contact plug that fills the storage node contact hole.

9. A semiconductor device comprising:
    a vertical cell transistor structure formed in a cell region;
    a recess formed in a core/peripheral circuit region;
    a gate formed within the recess so that a top surface of the gate is lower than a top portion of the vertical cell transistor structure in a core/peripheral circuit region; and
    an insulating film including a storage node contact hole that exposes a storage node junction region of the vertical cell transistor structure.

10. The semiconductor device according to claim 9, wherein the storage node junction region and the storage node contact are self-aligned.

* * * * *